United States Patent [19]

Gauthier

[11] Patent Number: 5,025,207

[45] Date of Patent: Jun. 18, 1991

[54] METHOD FOR THE MEASUREMENT OF A STEADY LEVEL IN A NOISE-INFESTED SIGNAL AND AUTOMATIC MEASURING DEVICE FOR THE APPLICATION OF THIS METHOD

[75] Inventor: Dominique Gauthier, Ermont, France

[73] Assignee: Thomson-LGT Laboratoire General des Telecommunications, Conelans Sainte Honorine, France

[21] Appl. No.: 381,959

[22] Filed: Jul. 19, 1989

[30] Foreign Application Priority Data

Jul. 22, 1988 [FR] France ................................ 88 09936

[51] Int. Cl.⁵ ............................................ G01R 23/16
[52] U.S. Cl. .................................. 324/77 A; 328/163; 328/167
[58] Field of Search .................. 324/76 R, 77 R, 77 A, 324/77 B, 77 E, 77 CS; 328/163; 329/325, 304; 367/77; 375/86, 76, 102; 307/358; 128/419 PG, 696, 901

[56] References Cited

U.S. PATENT DOCUMENTS

| 4,019,148 | 4/1977 | Shawhan | 328/167 |
| 4,577,335 | 3/1986 | Wong et al. | 375/86 |
| 4,672,635 | 6/1987 | Fischer | 328/163 |

FOREIGN PATENT DOCUMENTS

| 3700368 | 6/1988 | Fed. Rep. of Germany . |
| 2448722 | 9/1980 | France . |
| 2193580 | 2/1988 | United Kingdom . |

OTHER PUBLICATIONS

8140 Wireless World, vol. 87, May 1981, No. 1544, Sheepen Place, Colchester, Gr. Britain, J. L. Gordon, Data Store by Running Average.

Primary Examiner—Michael J. Tokar
Attorney, Agent, or Firm—Oblon, Spivak, McClelland, Maier & Neustadt

[57] ABSTRACT

The disclosure concerns automatic measuring stands. The automatic measurement of the amplitude of an intermodulation line at the output of a TV transmitter is difficult to achieve because this line is often drowned in a cloud of noise formed by the spectra of lines due to the numerous frequencies of the line frequency. The standard way to make the measurement is to do a visual interpretation. When the measurement is done automatically, this visual interpretation is not possible. The method according to the invention uses the a priori knowledge of the existence of a steady level at the peak of the line to be measured. The method consists in: considering the samples of the spectrum signal given by the analyzer, for a period of time corresponding to the duration of the steady level; considering a sequence of sections in the scale of the amplitudes; counting the number of samples having a value belonging to a given section, successively for each of the sections; determining that section which corresponds to the greatest number of samples, the value corresponding to this section constituting the amplitude value of the steady level.

6 Claims, 4 Drawing Sheets

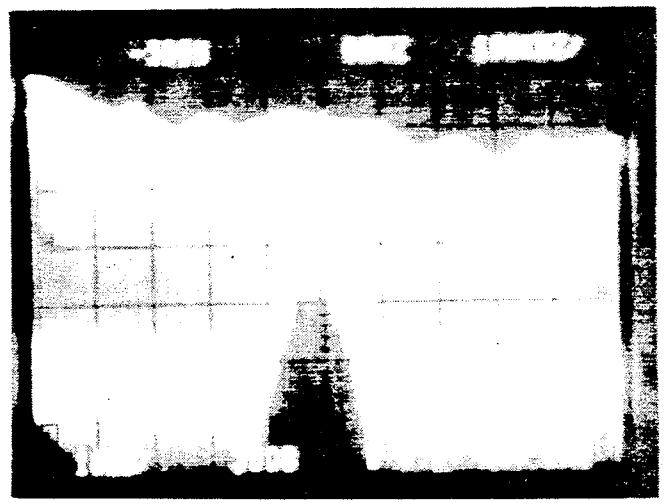
FIG_1
Fim    f2
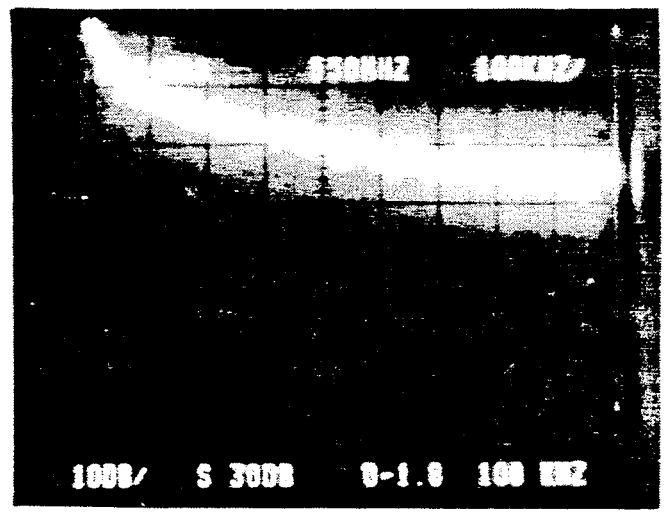
FIG_2
Fim    f2
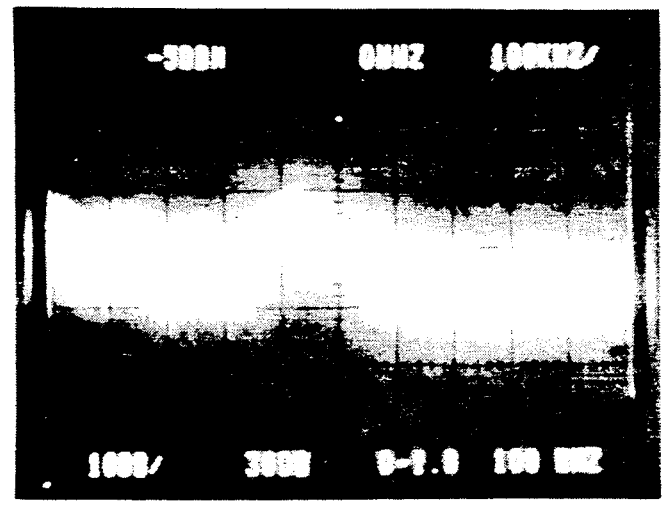
FIG_3
Fim    f2

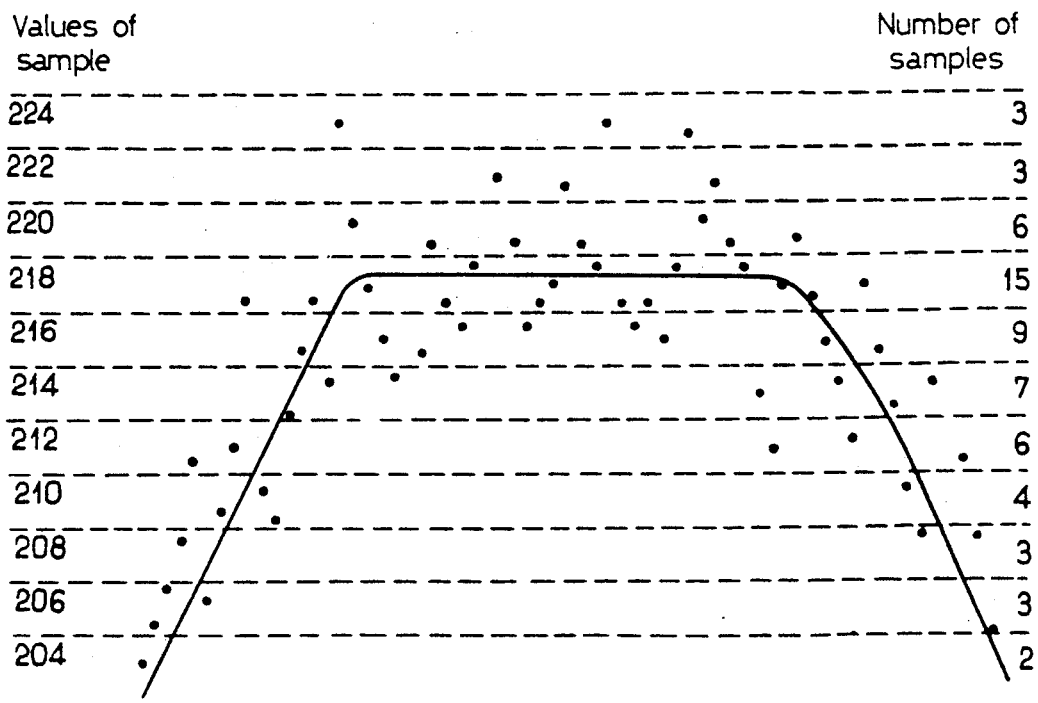
FIG_4
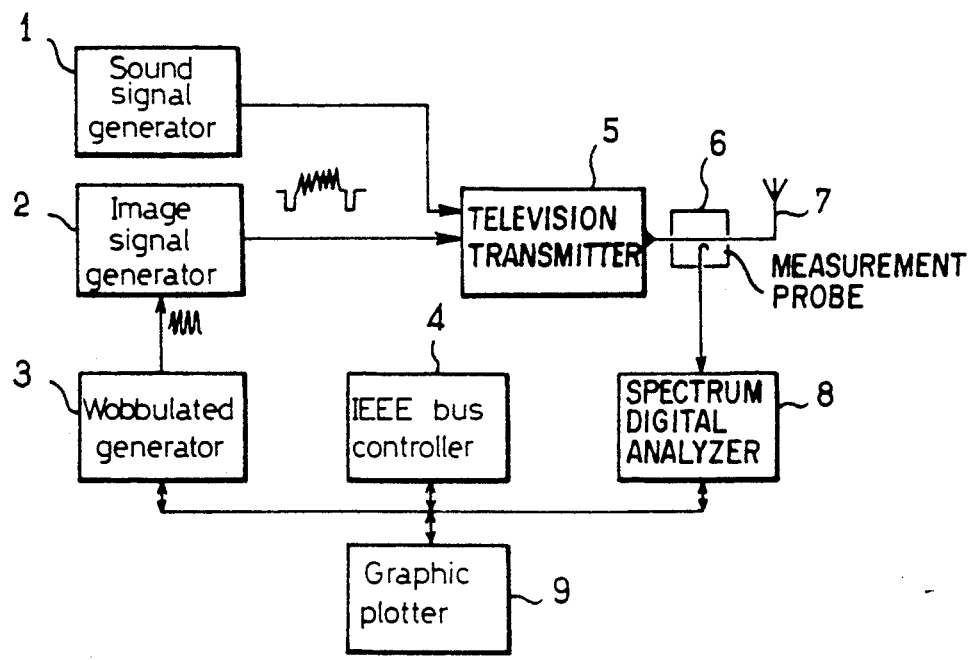
FIG_5

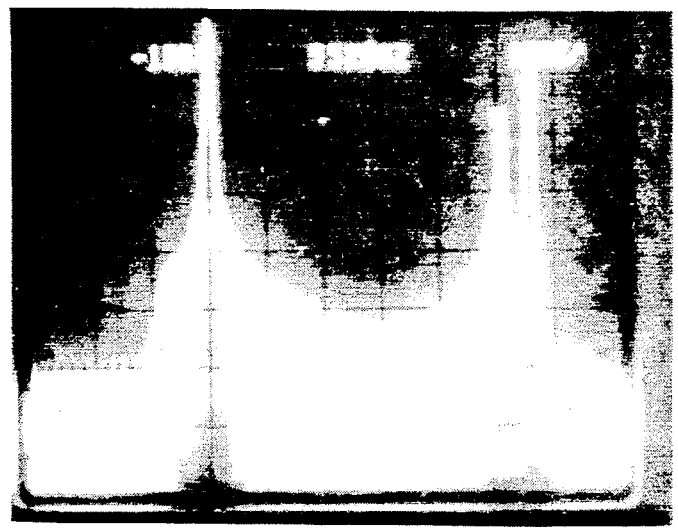
FIG_6
f1 f2        Fch Fson
  Fim
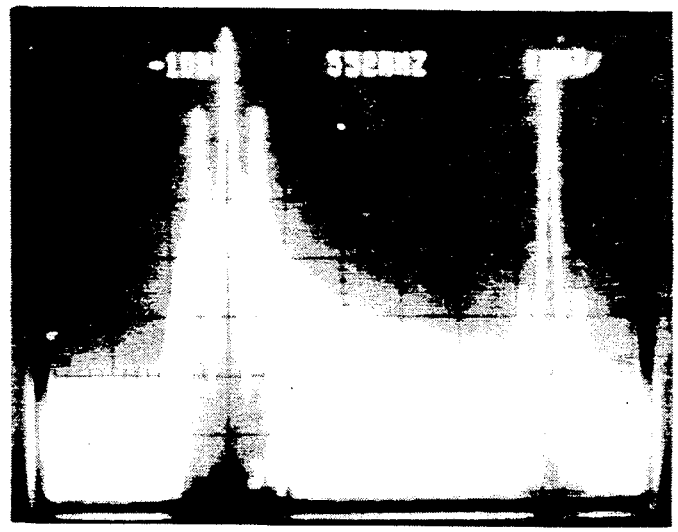
FIG_7
f1 f2        Fson
  Fim
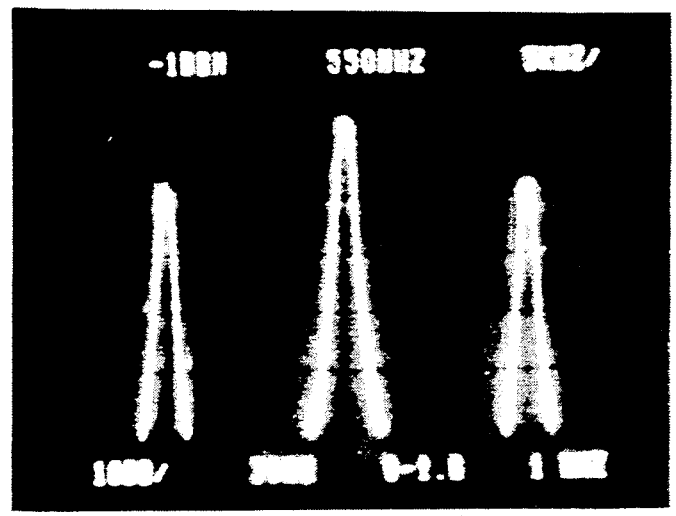
FIG_8
f2

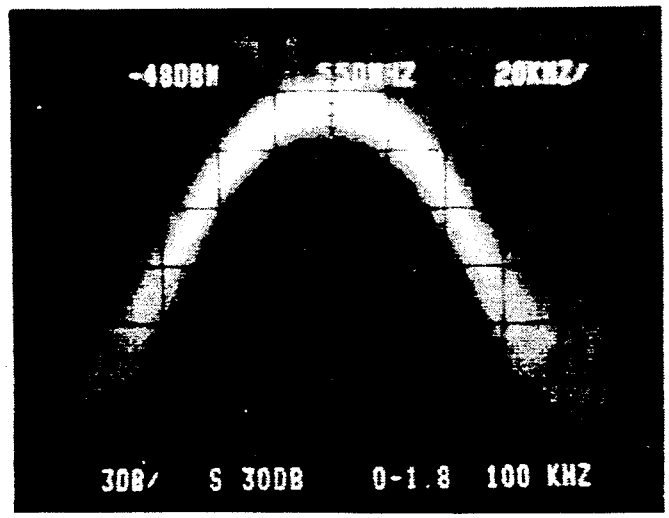
FIG_9
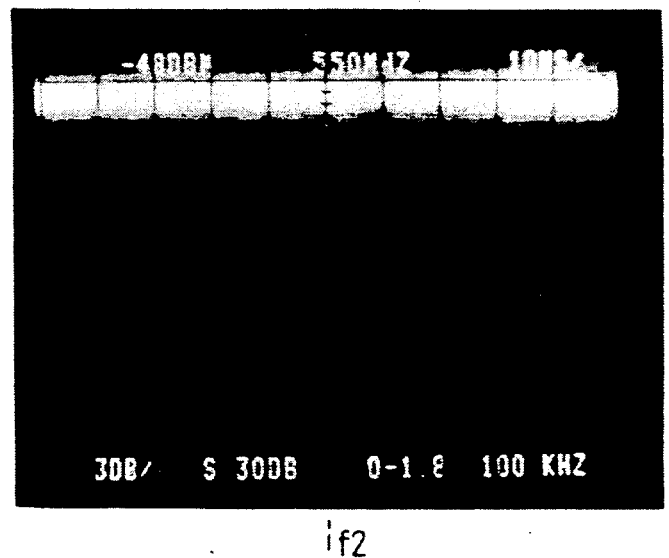
FIG_10
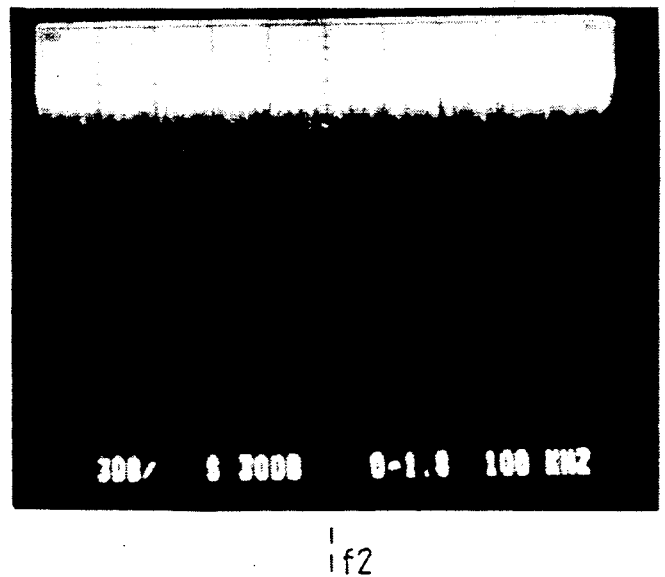
FIG_11

METHOD FOR THE MEASUREMENT OF A STEADY LEVEL IN A NOISE-INFESTED SIGNAL AND AUTOMATIC MEASURING DEVICE FOR THE APPLICATION OF THIS METHOD

BACKGROUND OF THE INVENTION

1. Field of the Invention

The invention concerns a method for the measurement of a steady level in a noise-infested signal, and measuring instruments to implement this method.

2. Description of the Prior Art

It is often necessary to measure a steady level in a noise-infested signal. For example, a steady level has to be measured in a signal formed by a voltage that is variable as a function of time, or else the amplitude of a line has to be measured in a spectrum that is variable as a function of time. A prior art method consists in displaying the graph of the signal, with the noise, on the screen of a cathode-ray tube and in visually interpreting the graph so as not to take into account the noise which is represented by a blurred zone having a decreasing luminance on either side of the trace corresponding to the useful signal. This visual interpretation achieves a sort of filtering which takes into account only the central part of the diffused trace appearing on the screen.

This method of visual interpretation is clearly not applicable to an automatic measuring device. In this case, it is common to use a low-pass filter that eliminates frequencies far greater than the fundamental frequency of the signal controlling the vertical deviation in the cathode ray tube. The drawback of this method is its lack of precision, for the measurement is falsified by the remainder of the filtered noise, which gets added to the useful signal, and may be falsified by a non-negligible deformation of the useful signal. The aim of the invention is to overcome this drawback of the prior art.

SUMMARY OF THE INVENTION

An object of the invention is a digital method which uses the fact that the statistical distribution of the samples of a noise signal, notably if the noise is Gaussian noise, is far denser around a null value.

According to the invention, a method for the measurement of the amplitude of a steady level in a noise-infested signal comprises the steps of:

sampling the signal during a time interval corresponding to the duration of the steady level to be measured;

quantifying the samples of the signal, according to a plurality of pre-determined digital values;

counting the number of samples, having each pre-determined digital value;

determining, in a range of fixed values, that value which corresponds to the greatest number of samples, said value forming the measured value of the amplitude of the steady level.

BRIEF DESCRIPTION OF THE DRAWINGS

FIGS. 1 to 3 are three photographs of the screen of a spectrum analyzer illustrating prior art measuring methods;

FIG. 4 is a graph illustrating the method according to the invention;

FIG. 5 is a block diagram of an embodiment of the automatic measuring device for the implementation of the method according to the invention;

FIGS. 6 to 11 are photographs of the screen of a spectrum analyzer used in this embodiment, and illustrate the implementation of the method according to the invention for the automatic measurement of a line of a spectrum.

DESCRIPTION OF A PREFERRED EMBODIMENT

FIG. 1 is a photograph of the screen of a spectrum analyzer and illustrates an example where it is difficult to measure the amplitude of a steady level in a noise-infested signal. The aim of the measurement is to measure the amplitude of a line created by the inter-modulation of a chrominance carrier and an image carrier in a television signal that goes through an amplifier or an emitter having a common channel for the image and for the sound. In this picture, the inter-modulation line is located at a frequency f2 which is not very far from the frequency Fim of the image carrier, corresponding to the left-hand edge of the photograph. The intermodulation line appears like a peak with a diffused trace and, above all, one that is surmounted by various lines due to multiple frequencies of the line frequency. These various lines appear as an amplitude noise greater than the amplitude of the intermodulation line to be measured.

A visual interpretation of what appears on the screen makes it possible to distinguish the intermodulation line by its luminosity which is somewhat greater than that of the superimposed noise but is, nonetheless, quite diffused. When an automatic measurement has to be made of the amplitude of this line, it is common to use a digital spectrum analyzer, controlled by a IEEE bus controller, connected to the analyzer by a bus transmitting, to the analyzer, control signals that replace manual adjustments and transmit the data recorded by the analyzer to the controller.

It is not possible to obtain a precise automatic measurement of the amplitude of the intermodulation line at the frequency f2, directly on the basis of recorded data corresponding to the image of FIG. 1, because of the superimposed noise. These items of data are formed by the digital values of a sequence of samples, each spectrum sample corresponding to a light dot on the screen. The width of the screen corresponds, for example, to 1000 samples. The items of data corresponding to each sample are formed by its abscissa on the horizontal axis of the screen and by its ordinate on the vertical axis of the screen, and said ordinate can then assume a whole number value of between 0 and 255. On the screen, zones with greater luminosity are those where the samples are the closest to one another.

Conventionally, a digital spectrum analyzer has one or more switch-over filters acting on the signal controlling the vertical deflection in the cathode ray tube. These filters make it possible to eliminate at least a portion of the noise hampering the observation of the spectrum on the screen. FIG. 2 is a photograph of the screen of the analyzer representing the same spectrum as the photograph of FIG. 1, but putting into service a first type of filter which lets through only the envelope of the signal controlling the vertical deviation. The spectrum displayed on the screen is actually the envelope of the cloudy zone forming the lines due to the multiple frequencies of the line frequency. The inter-modulation line at the frequency f2 disappears completely. It is therefore not possible to use this first type of filter to achieve, visually or automatically, a measurement of the considered intermodulation line.

Conventionally, a spectrum analyzer also has a switch-over filter which performs a low-pass filtering on the signal controlling the vertical deflection. FIG. 3 is a photo of the display obtained on the screen, for the same spectrum as that of FIG. 1, and with the same settings of the analyzer with, however, the use of the averaging filter. It would seem that this filtering has eliminated the cloudy zone due to the lines of the multiple frequencies of the line frequency. It is possible to make a visual or automatic measurement of a horizontal steady level in the vicinity of the frequency f2, where the expected intermodulation line is located. However, it would appear that the measured value is erroneous with respect to the value measured on the photograph of FIG. 1. The error, which is of the order of 10 dB herein, is all the greater as the noise level is greater than that of the steady level to be measured. This error is due to the fact that the averaging filter includes highly noise-infested samples in the computation of the value of the mean signal designed to control the display. This type of filtering can therefore not be used when an automatic measurement has to be made with high precision, namely, of the order of 0.5 or 0.2 dB.

The measuring method according to the invention uses the a priori knowledge of the existence of a steady level during a known time interval in the considered signal. It also uses the fact that the noise affecting the signal is generally a Gaussian noise, or at least a noise for which the values have a statistical distribution strongly concentrated around the value zero. The samples which have a value that is equal or close to the real value of the steady level in the absence of noise are therefore more numerous than the samples having a value substantially different from the value of this steady level. This difference in distributions enables the steady level to be located. The samples for which the value is not considered as being close are therefore considered as being excessively noisy and are not at all taken into account. The method therefore achieves a filtering wherein the samples considered as being close to the steady level are weighted by a coefficent equal to 1 whereas the samples for which the value is not considered as being close to the steady level are weighted with a coefficient equal to zero, and whereas the standard low-pass filtering method achieves a mean wherein all the samples, even when they are completely aberrant, have an equal weight.

FIG. 4 shows a graph illustrating an example of the implementation of the method according to the invention. In this figure, each black dot represents a sample of a noise-infested signal which is a signal applied to the display device of a spectrum analyzer. In this example, the signal represents a line having a trapezoidal shape, with a horizontal steady level in the middle of the display screen. The curve drawn in a dark trace represents the line as it would be seen in the absence of noise, whereas the actually observed spectrum is formed by the black dots which are actually connected by the light trace of the spot on the display screen. This trace, connecting the samples, is not shown for greater clarity. In this example, the samples may assume whole number values of 0 to 255. The scale of the values of the sample is shown on the left-hand side of the figure. The measurement of the value of the steady level consists in cutting up this scale 0–255 into sections of two units each, and of then counting the number of samples having a value included in each section. For example, the samples having a value equal to 209 or 210 are four in number. The number of samples belonging to each section is shown at the right-hand of the figure.

The procedure then consists in determining which section has the greatest number of samples. In this example, it is the section of samples with a value 217 or 218 that contains 15 samples. The two neighbouring sections respectively contain 609 samples. The steady level is considered to be located in the section of the values 217 and 218. Its value in decibels, with respect to a reference, may then be computed from the setting parameters of the analyzer.

FIG. 5 shows a block diagram of an embodiment of an automatic measuring stand to achieve intermodulation measurements on a television transmitter having a common channel for image and sound, in implementing the measurement method according to the invention. This automatic measuring stand has: a sound signal generator 1; an image signal generator 2; a wobbulated generator 3, giving a chrominance carrier; a bus controller, IEEE 4; a television transmitter 5 to be tested; a measurement probe 6; an antenna 7 to charge the output of the transmitter 5; a spectrum digital analyzer 8; and a graphic plotter 9 to automatically plot the graph of the amplitude of the measured intermodulation line as a function of the frequency of the chrominance carrier, which is wobbulated throughout the range of the video band between image carrier and sound carrier.

The transmitter 5 has: a first input connected to an output of the sound signal generator 1, which gives it a carrier modulated by an audio signal; a second input connected to an output of the generator 2 of the image signal, which gives it an image carrier modulated by a chrominance signal, the chrominance carrier of which is wobbulated; and an output connected to the antenna 7 by means of the measuring probe 6. The generator 2 has an input connected to an output of the wobbulated generator 3 which gives it a wobbulated chrominance carrier.

The generator 3, the controller 4, the analyzer 8 and the graphic plotter 9 each have an input/output connected to the IEEE bus. The controller 4 controls the generator 3 to make the chrominance frequency vary. It controls the analyzer 8 to measure the amplitude of the intermodulation line in the spectrum of the signal given by the output of the transmitter 5, and it controls the graphic plotter 9 to plot the graph of the measurement results. The generator 3, the controller 4, the analyzer 8 and the graphic plotter 9 are standard measuring instruments which can be controlled by an IEEE bus. The controller 4 is a standard microprocessor device performing a control sequence of the measuring stand, and then a sequence of computations in a program previously loaded in the controller. The controller 4 applies the method according to the invention in applying it to the values of the samples read in the screen memory of the analyzer 8.

The controller 4 controls the measuring stand to achieve a sequence of measurements corresponding to a sequence of values Fch of the chrominance frequency. When the generator 1 gives a sound signal with a carrier frequency Fson and when the generator 2 gives an image signal having a carrier frequency Fim, with a chrominance signal having a carrier frequency Fch, the transmitter to be tested restores a signal with two main intermodulation lines having the frequency:

$$f1 = Fim - Fson + Fch$$

$$f2 = Fim + Fson - Fch$$

The two lines have equal amplitudes. Only the frequency f2 line, for example, is measured. The controller 4 computes f2 for each given value Fch, according to the above formula, and then controls the sequence of operations needed to do a measurement at this frequency f2.

FIG. 6 is a photograph of the spectrum displayed on the screen of the spectrum analyzer when it is set to display the entire spectrum of the signal given by the output of the transmitter 5. In this example, the television signal is within German B/G standards. The carrier of the sound signal, having a frequency Fson is at 5.5 MHz of the frequency Fim of the image carrier. In the example shown, the frequency Fch of the chrominance carrier is located at 5 MHz of the image carrier frequency Fim, on the same side as the carrier frequency of the sound signal. According to the above formulae, the intermodulation produces two lines located at 0.5 MHz on either side of the image carrier frequency Fim.

The reference of the measurements is formed by the amplitude of the image carrier. For the norm considered, the carrier of the sound signal has an amplitude of $-10$ dB and the chrominance carrier has an amplitude of $-16$ dB. Thus, the amplitude of the two intermodulation lines has a value generally within the range of $-48$ to $-75$ dB. This value is far smaller than the amplitude of the nebulous spectrum created by the multiple frequencies of the line frequency. This is why it is difficult to distinguish it on the display screen and in the photograph (the amplitude of the intermodulation lines). To distinguish these lines more efficiently, the zone of the spectrum where one of these lines is located has to be expanded in centering it on the analyzer screen.

The measurement of intermodulation on a TV transmitter is achieved for an entire sequence of values of the frequency Fch of the chrominance signal in such a way that the intermodulation lines get shifted on the entire interval between Fson and Fim. Each measurement of an intermodulation line at a predetermined frequency f2 gives rise to a sequence of operations described below. These operations are programmed in the controller 4 and are achieved automatically, then the controller 4 modifies the carrier frequency of the chrominance by fixed value increments before making the next measurement.

A first step of the method according to the invention consists in sampling the noise-infested signal in the most useful time interval, namely for the duration of the steady level to be measured. In practice, this consists in setting the analyzer to center the window of observation precisely on the frequency f2 where an intermodulation line is expected for a given chrominance frequency. This frequency f2 is known in principle but, unfortunately, the precision of a centering done directly on the frequency f2 is oftten inadequate.

To center the observation window with precision, one method consists in ordering the analyzer to make an automatic search for the maximum amplitude line in a given observation window and then in centering the observation window on the line thus detected. Unfortunately, this automatic operation takes into account only the envelope of the spectrum and, consequently, cannot detect the peak of the intermodulation lines when their amplitude is below the noise formed by the spectrum of the multiple frequencies of the line frequency. One remedy is to simulate the intermodulation line by injecting, at the frequency f2, an amplitude carrier greater than the noise. This can be done simply by giving the value f2 to the frequency of the chrominance carrier while keeping its amplitude of -16 dB. Before this centering operation, the frequency of the chrominance carrier assumes the value Fch needed for the measurement proper.

FIG. 7 is a photograph of the spectrum displayed on the analyzer screen when the chrominance carrier has the frequency f2 to simulate the intermodulation line. This spectrum has two lines with an amplitude greater than the noise, respectively located at the frequencies f1 and f2 on either side of the image carrier frequency. It must be noted that the intermodulation causes the appearance of two lines located on either side of the carrier frequency of the sound signal. The centering operation can then be achieved with precision on the frequency f2 since the line at f2 has an amplitude greater than that of the noise. The analyzer is controlled to center its observation window on the peak of the existing line at the frequency f2.

FIG. 8 is a photograph showing the spectrum observed after this centering operation. The observed spectrum has three lines. The central line, which is the biggest line, is located at the frequency f2. The other two lines are lines produced by multiple frequencies of the line frequency.

To achieve a precise measurement of amplitude, the steady level forming the peak of the line has to be made to appear very widely by expanding the observed spectrum to the greatest possible extent. This expansion also expands the centering error. Consequently, this centering error has to be removed by performing a new centering operation before going on to the step for measuring the real amplitude of the intermodulation line. The method consists in controlling a first change in horizontal scale and then in ordering a first search for the maximum amplitude line in the observation window, and then in ordering a first centering of this line at the center of the observation window. Then a second change of the horizontal screen is ordered and then a second search for the maximum amplitude line and then a second centering of this line are ordered. These operations are repeated until the horizontal scale has been expanded to the maximum possible extent on the analyzer used. The analyzer is then ready to enable the real measurement of amplitude of the intermodulation line as efficiently as possible.

The method then consists in commanding the generator 3 so that it gives a chrominance carrier having the frequency Fch corresponding to the frequency f2 on which the centering has just been done. The measured values are expected to be in the range $-48$ dB to $-75$ dB with reference to the amplitude of the carrier of the image signal. The analyzer is thus controlled so that its vertical scale is centered on this range of values.

The second step of the measuring method according to the invention is similar to the one described, by way of example, with respect to FIG. 4. The computed amplitude is transmitted to the graphic plotter, with the value f2, to record a point of the measuring graph, and then the previous operations are repeated for a new value of f2.

FIG. 9 is a photograph of the intermodulation line at the frequency f2, directly displayed on the screen in a similar way during the above-described centering operations. The line is perfectly centered in the observation window. FIG. 10 is a photograph of the screen showing the same line, in a similar way, after maximum expansion of the horizontal scale. FIG. 11 shows the same spectrum as that of FIG. 9, but in going through the digital processing of the analyzer and with the same settings as this analyzer. This image therefore corresponds to the data used to automatically determine the steady level.

This exemplary application comprises two additional operations used to improve the dependability of the measurement. A first operation consists in comparing the value of each sample with a maximum fixed limit, in this example 225, to eliminate all the values which are so great that they certainly do not belong to the steady level. This operation notably removes a large number of samples having values 255 after expansion of the vertical scale, for the values then level out at 255.

In a second operation, the measurement of a steady level is validated only after its existence is confirmed through computation of the mean value of the samples taken into account after the above-described first operation, and by comparing this mean value to two limits fixed, for example, at −48 dB and −75 dB. If the mean value is actually between these limits, it confirms the existence of the expected steady level between these two limits. If not, irrespectively of the measured value, the existence of a measurable level is doubtful.

The above-considered case is one where the measurement of the intermodulation line is most difficult because the line is close to the carrier frequency of the image signal, hence, in a zone where the noise level created by the multiple frequencies of the line frequency is particularly great. Naturally, the method according to the invention can be implemented in the same way to measure the intermodulation line when, the chrominance frequency having been modified, this intermodulation line is in the vicinity of the carrier frequency of the sound signal. It then has a level comparable to the level of the noise spectrum and the measurement of the amplitude of this line is thus made easier.

The method according to the invention can be applied not only to digital analyzers of spectra but to any other digital measuring device when visual interpretation has to be replaced by automatic measuring method, to measure a level for which the temporal position is known in principle. Notably, this measuring method can be applied to an automatic measuring stand having a digital oscilloscope instead of a digital spectrum analyzer.

What is claimed is:

1. A method for the measurement of the amplitude of a steady level in a noise-infested signal comprising the steps of:
    sampling the signal during a time interval corresponding to the duration of the steady level to be measured;
    quantifying the samples of the signal, according to a plurality of pre-determined digital values;
    counting the number of samples, having each pre-determined digital value ;
    determining, in a range of fixed values, that value which corresponds to the greatest number of samples, said value forming the measured value of the amplitude of the steady level.

2. A method according to claim 1 wherein, furthermore, the samples having values greater than a fixed maximum limit are not counted.

3. A method according to claim 2 wherein, to check the existence of a steady level in the noise-infested signal during the time interval in which it is sampled, said method further consists in the step of computing the mean arithmetical value of the samples having a value smaller than the maximum limit; and in the step of checking that this mean value is within an interval of values where the value of the steady level is likely to be located.

4. A device for the measurement of the amplitude of a steady level in a noise-infested signal comprising:
    means to sample the signal during a fixed time interval corresponding to the duration of the steady level to be measured;
    means to quantify the samples of the signal, according to a plurality of pre-determined digital values;
    means to count the number of samples respectively having each pre-determined digital value , and to determine that value which corresponds to the greatest number of samples, said value forming the measurement of the amplitude of the steady level of the noise-infested signal.

5. A device according to claim 4, wherein the means to count the number of samples, having each pre-determined value , and to determine the value corresponding to the greatest number of samples, do not take into account the samples having a value greater than a fixed limit.

6. A device according to claim 5, further comprising means to: compute the mean value of all the samples taken into account; compare this mean value with two limits; and validate the measurement of the steady level only if the mean value is between the two limits.

* * * * *